United States Patent [19]

Lerude et al.

[11] Patent Number: 4,630,175

[45] Date of Patent: * Dec. 16, 1986

[54] ELECTRONIC CARD HOLDING CELL-LIKE STRUCTURE

[75] Inventors: Gérard Lerude, Antibes; Christine Roux, Le Rouret, both of France

[73] Assignee: La Telemecanique Electrique, France

[ * ] Notice: The portion of the term of this patent subsequent to Oct. 28, 2003 has been disclaimed.

[21] Appl. No.: 699,098

[22] Filed: Feb. 7, 1985

[30] Foreign Application Priority Data

Feb. 8, 1984 [FR] France ............................... 84 01916

[51] Int. Cl.$^4$ ............................................... H05K 5/02
[52] U.S. Cl. ................................... 361/424; 174/52 R; 211/41; 339/76; 339/141; 361/415; 361/420
[58] Field of Search ................................ 361/390–391, 361/394–395, 399, 413, 415, 420, 424, 427; 174/52 R; 339/76–78, 4, 141; 211/41, 44

[56] References Cited

U.S. PATENT DOCUMENTS 3,476,983 11/1969 Robertis ............................ 361/413

Primary Examiner—A. T. Grimley
Assistant Examiner—Jane K. Lau
Attorney, Agent, or Firm—William A. Drucker

[57] ABSTRACT

An electronic card holding cell-like structure formed by the assembly of at least two modular electronic card supporting and protecting cells together, each of these modular cells having a blank and perpendicularly thereto, from its rear edge portion and its two side edge portions, respectively a bottom and two lateral sides, in which are formed two respective lateral slides parallel to the flat portion. The two longitudinal edge portions of each of the lateral sides of the modular cell being provided with respectively complementary fixing means so as to allow fixing of two adjacent modular cells.

22 Claims, 11 Drawing Figures

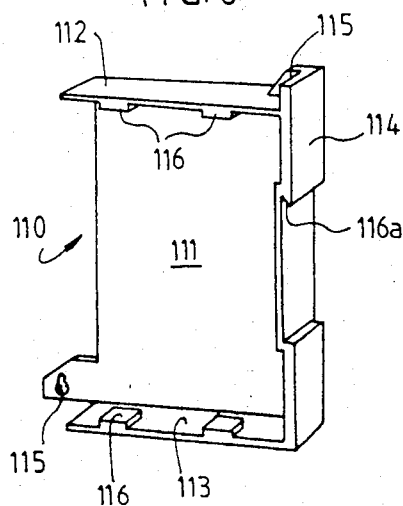
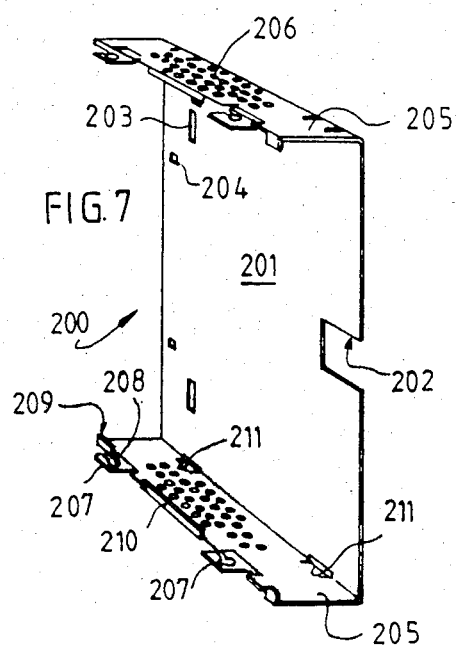
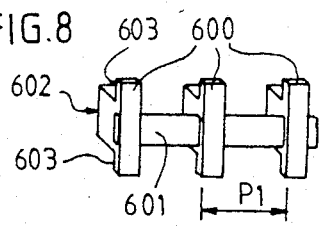
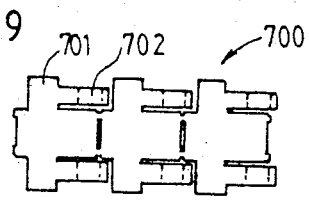
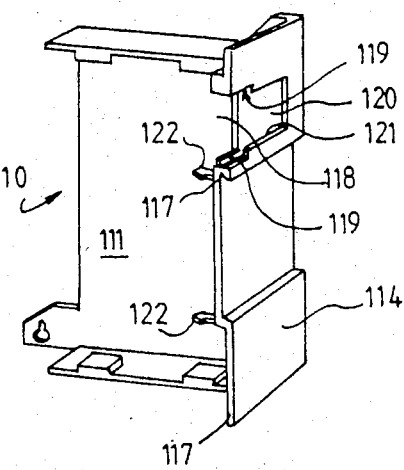
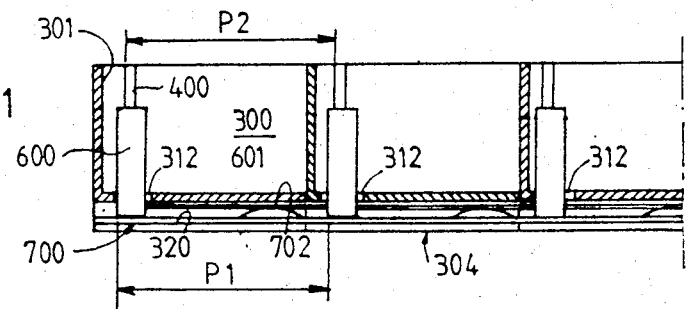

ELECTRONIC CARD HOLDING CELL-LIKE STRUCTURE

BACKGROUND OF THE INVENTION

Field of the Invention

The present invention relates to an electronic card holding cell-like structure obtained by juxtaposition and assembly of modular support and protection cells each one adapted to receive a card.

Generally it is known to form multicard electronic devices by juxtaposing and, if required, assembling elementary pockets each containing an electronic card.

These devices usually comprise a rigid base containing rear connectors and intercard connecting wiring and having pockets containing the cards. This base further provides alignment and fixing of the pockets.

It is clear that the overall length of these devices is necessarily that of the base, whatever the number of cells used.

Another known method of assembly consists in juxtaposing complete closed cases each housing an electronic card and an intercard wiring section for example a bus section between a male connector and a female connector, fixed respectively to each blank of the case. The overall length of such a device corresponds it is true to its effective length but the cases must be designed with accurate dimensions so as to guarantee good conditions for interconnection and assembly; this accuracy associated with the requirements for wiring the bus section contained in each case increases the cost of the component parts of the device and increases the assembly time.

The invention has especially as aim to overcome these disadvantages and provides a cell-like structure formed from modular cells adapted so as to be able to be readily assembled together without having to use any tool and for facilitating the connections.

Another aim is to reduce as much as possible the number of parts comprised in the structure and the precision thereof while eliminating the residual assembly free motions.

A further aim is to improve the convenience of fixing, using and exchanging the cards used in this structure.

SUMMARY OF THE INVENTION

To reach these results, the cell like structure is formed by assembling at least two modular electronic cards supporting and protecting cells each comprising, on the one hand, a flat element or blank having two parallel lateral edge portions, a front edge portion and a rear edge portion and, on the other hand, extending perpendicularly to said blank, from its rear edge portion and from its two side edge portions, respectively a bottom or base and two lateral sides having means for guiding the cards forming two respective lateral slides parallel to the blank and at a small distance therefrom, the spacing of these two slides being provided so that the cards may be engaged therein by two of their opposite lateral edge portions and then slide therein. These cells define therefore a substantially parallelepipedic volume open on its face opposite said blank and on its front side opposite said bottom.

According to the invention, the lateral sides of the cell each comprise a first longitudinal edge portion adjacent said blank and a second longitudinal edge portion opposite the first one, these two longitudinal edge portions comprising respectively complementary fixing means so that the two adjacent cells may be fixed by assembling the first longitudinal edge portions of the lateral sides of the first cell on the second longitudinal edge portions of the lateral sides of the second cell.

With this method of assembly, the blank of the first cell closes the open face of the second cell, so that thus a pocket is obtained open solely on its front side, through which opening the card is introduced.

It is clear that the assembly of a third modular cell on the first two allows a second pocket to be obtained and so one. Thus it is possible to obtain a cell-like structure comprising the desired number of pockets or cells.

However, in this structure, one of the two modular endmost cells will remain open.

This is why the invention further provides a head base comprising at least one flat face equipped with fixing means complementary to those provided on said second longitudinal edge portions of the modular cells. Thus, this head base may close the endmost modular cell which remains open.

Of course, this head base may have multiple shapes. It may for example consist of a case containing electronic equipment, connectable to the cards housed in the modular cells. It may also have a form similar to that of the modular cells and then comprise, in a similar way, a flat wall having two parallel lateral edge portions, a front edge portion and a rear edge portion and, on the other hand, extending perpendicularly to said wall, from its rear edge portion and from its two side edge portions, respectively a bottom and two lateral sides. In this case, the longitudinal edge portions of these lateral sides, opposite said wall, are provided with fixing means complementary to those provided on the second edge portion of the lateral sides of the modular cells.

Furthermore, the bottom of said modular cells and possibly the head base may advantageously have at least one window for passing a rear connector pluggable in the rear connections of the card. In this case, the rear face of the bottom of the modular cell and possibly the head base have, at right angles to said window, bearing surfaces for corresponding faces of the connector as well as means for securing said connector.

The bottom of the modular cells and the head base may further have a conformation for fixing it on the support element such as a standardized rail as well as guides for receiving a sliding catch for locking said bottom on said support element. The bottom may also comprise an indentation disposed so as to form, when two cells are assembled together, a recess for fixing the rear of the structure to a support element.

According to another feature of the invention, said modular cells are formed in two parts, namely:

a cellular element made from an insulating material, preferably from a molded plastic material and comprising, on the one hand, a flat element or blank having two parallel lateral edge portions, a front edge portion and a rear edge portion and, on the other hand, extended perpendicularly to said blank, from its rear edge portion and from its two side edge portions, respectively a bottom and two lateral sides having means for guiding the cards forming two respective lateral slides, parallel to the blank, and a metal shield with a U shaped section whose web covers at least partially the blank of the cellular element and whose two wings come back against the two said lateral sides so as to form together the two lateral sides of the modular cell.

In this case, said fixing means equipping the lateral sides of the modular cell are provided on the wings of the shield. Advantageously, the free edge portions of the wings of the shield may comprise inwardly bent portions so as to allow the cellular element to be slid inside the shield. Said fixing means may then consist of hooks projecting from the free edges of the wings of the shield and from corresponding cut-outs provided in the bending zone situated between the web and the wings of said shield, so that said hooks of a modular cell may be engaged in the cut-outs of an adjacent modular cell offset axially, locking being then obtained by axial translation centering one of the cells with respect to the other.

The invention further provides means for centering the cellular element by snap fitting in the shield as well as means for centering the cellular elements of the structure, with respect to each other.

Thus, in one embodiment of the invention, the means for centering the cellular elements with respect to their shield comprise openings forming latches for catches provided at corresponding positions on the blank of the cellular element. The elements for centering the cellular elements of the structure comprise male elements provided on one of the longitudinal side portions of the bottom which fit into female elements provided on the other longitudinal edge portions of the bottom.

The layout of the centering elements and fixing means equipping the shield may then be provided so that the structure may be assembled in the following steps:

1. A partial introduction, by sliding, of the cellular element of a first modular cell in its shield,
2. Centering of this cellular element with respect to the cellular element of a second adjacent modular cell already assembled with engagement of the fixing means of the shield of the first cell in the corresponding fixing means of the shield of the second cell,
3. Axial translation of the shield of the first cell until it is centered with respect to its own cellular element by said self centering means and is locked to the shield of the second modular cell.

Of course, the assembly of the modular cells of the head base may be provided similarly, it being understood, of course, in this case that the bottom of the base may also comprise centering elements complementary to those equipping on one side the bottom of the cellular structure of the modular cells.

BRIEF DESCRIPTION OF THE DRAWINGS

The advantages and features of the invention will be clear from the following description of one embodiment of the invention given by way of non limitative example, with reference to the accompanying drawings in which:

FIG. 6 is a rear perspective view of a head base, FIG. 7 shows, in front perspective, the shield of a modular cell, FIGS. 8 and 9 show a rear connecting assembly and a plate for securing this assembly, FIG. 10 shows, in rear perspective, a variant of the head base, FIG. 11 is a partial sectional view of a pocket structure at right angles to the connecting windows.

DESCRIPTION OF THE PREFERRED EMBODIMENTS

Figure 1:
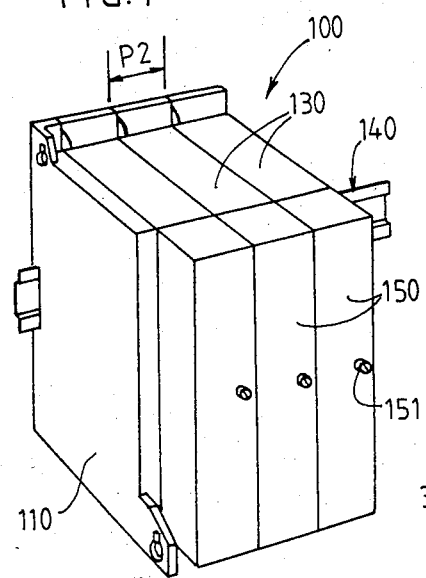
FIG. 1 is a perspective view of one embodiment of a cell-like structure having three pockets formed from card guide cells in accordance with the invention.

The electronic card holding cellular structure 100 shown in the figures comprises a head base 110 and several modular cells 130 each having an insulating card-guide cellular element 300, each cellular element 300 being covered with a metal shield 200 and being adapted for receiving an electronic card 400.

The modular cells 130 are assembled together so as to form a rigid multi-card assembly, for example a programmable controller, this assembly being fixed laterally or by its rear part to a support, for example to a standardized rail 140 or to a plate. Each modular cell receives a terminal strip 150 on its front face.

Figure 2:
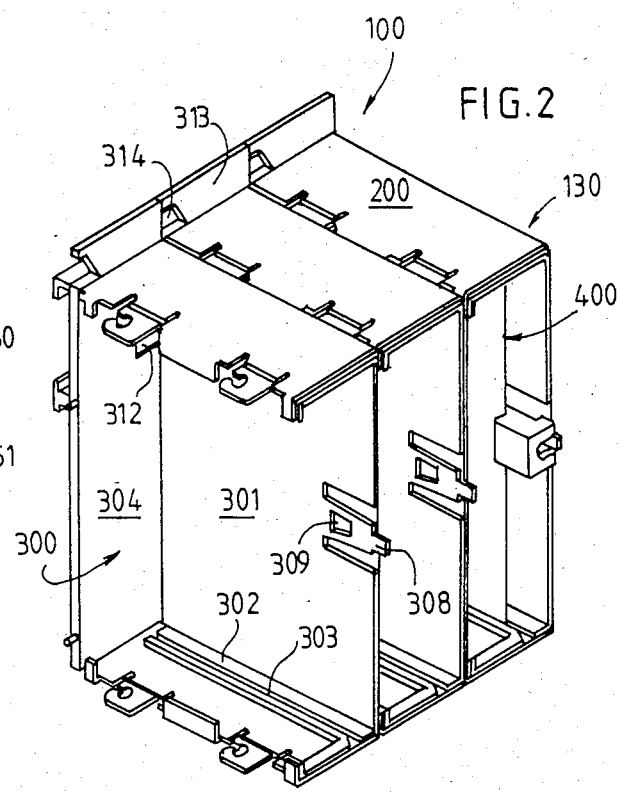
FIG. 2 shows a part of the same device in perspective.

The cellular element 300 is molded as a single piece so as to have the form shown in FIG. 2; it is held in position and protected by being fitted into the metal shield 200 (FIG. 7) and forms, at the same time as a housing for card 400, a means for fixing the card and its front terminal strip 150 and a means for mutually positioning the card and its rear connector 600.

The cellular element 300 comprises (FIGS. 2 to 4) a flat element or blank 301 protecting the soldered face of the electronic card, two lateral sides or L shaped flaps 302 having slides 303 for the card and a bottom 304 intended to form a rear fixing base. Flaps 302 are connected to the blank 301 by hinge lines 305, whereas slides 303 open towards the front through V shaped openings 306 ; the small leg of the L of each flap has a step 307.

Figure 3:
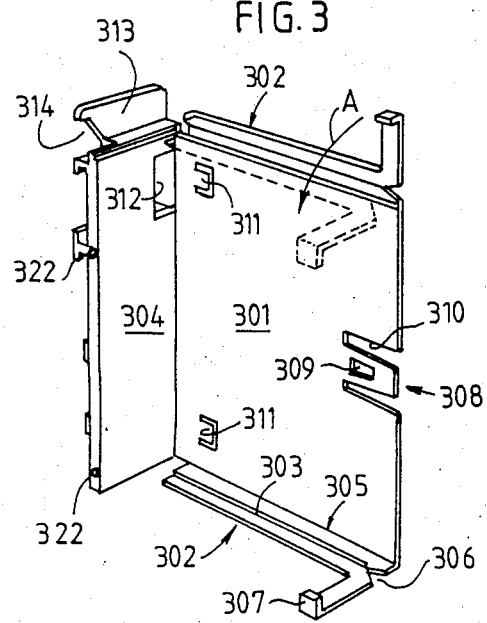
FIG. 3 shows, in perspective, a card guide cellular element used in the structure shown in FIG. 1.
Figures 4, 5:
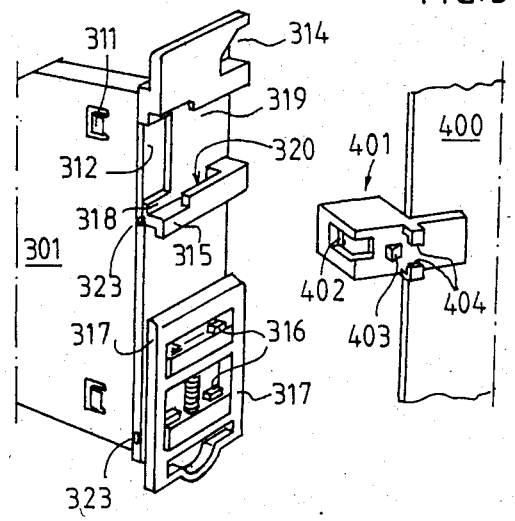
FIG. 4 shows the rear face of the bottom of the same cellular element.
FIG. 5 shows the detail of the edge of a card usable in a modular cell in accordance with the invention.

The flaps 302 are bent as shown by arrow A in FIG. 3 so as to occupy the position shown with broken lines for the upper flap and with a continuous line for the lower flap. A snap-fit or other means is provided for fixing the flaps 302 to the bottom 304.

Blank 301 further comprises a resilient tongue 308 having a recess 309, the tongue and the recess having a V shape converging towards the front, the tongue being situated in a front clearance 310 provided in the edge of the blank.

In the rear part of the blank are provided resilient catches 311 whose role will be explained further on.

The bottom or base 304 of the card guide cell 300 has a window 312 for freely passing therethrough the connector 600 associated with the cell, this window having a width greater than that of the connector so as to allow lateral movement thereof. Bottom 304 further comprises an upper lug 313 with lateral fixing notch 314, as well as at the rear (FIG. 4) a grooved projection 315 for fastening on to the standardized rail and guides 316 for receiving a sliding catch 317 for locking the cellular element 300 on the rail. The cellular element 300 may thus be fixed directly either to a rail or to any support by means of a screw engaged in the recess 314 closed by the lug of an adjacent modular cell or by the base (FIG. 2).

On the rear face of the bottom 304, the cellular element 300 has, at right angles to the window 312, bearing faces 318 for cooperating faces of the connector 600 and an indented housing 319 defining notches 320 for receiving means securing the connector which will be described further on.

Complementary centering elements, namely pins 322 and holes 323, are provided respectively on each side of bottom 304 on the lateral faces thereof for allowing assembly between modular cells or between modular cell and base.

The metal shield 200 shown in FIGS. 2 and 7 has a U section whose web 201 has an opening 202 corresponding substantially to the clearance 310 provided in the lateral dividing wall 301 of the associated cellular element, as well as openings 203 and 204. Openings 203 form latches for the catches 311 of the cellular element 300, whereas openings 204 receive if provided, the catches of the base. The wings 205 of the U shaped shield have regular perforations 206, lugs 207 with slits 208 forming hooks and bent stiffening and abutment portions 209, 210, more especially for the step 307 of the L shaped flap of the cellular element.

Slits 211 are formed by cutting the bends of the U, whereas the lugs 207 are situated in planes offset towards the inside with respect to the planes of wings 205 of the shield; thus, two adjacent modular cells are assembled together by fitting the lugs 207 of the shield of one into the slits 211 of the lugs of the shield of the other then by sliding the shields relatively perpendicularly so as to engage the slits 208 of one on the web 201 of the other.

On the front edge of each card 400 is disposed a fixing block 401 (FIG. 5) having towards the front an anchor nut or tapped orifice 402 for fixing therein a screw 151 provided on the associated terminal strip 150, and having laterally a catch or other locking element 403 adapted for cooperating with the recess 409 in the resilient tongue 308 of the cellular element.

Two guide projections 404 are provided on the side of block 401 for guiding the resilient tongue 308 when the card is introduced into the modular cell. The length of recess 309 is such that it receives the catch 403 with play, the card being placed in abutting engagement by means of the screw 151 of the terminal strip 150, as will be described further on.

The head base 110 made from a molded metal is adapted so as to house the power supply of the multi-card device and, when this device is a controller, for housing the central unit of this latter; it has a flat wall 111, two lateral sides 112, 113 and a bottom 114. The flat wall 111 has fixing orifices 115 usable for fitting the cellular structure to a lateral support. Each lateral side 112, 113 comprises two sleeves 116 adapted for engaging the fixing lugs 207 of the shield of the adjoining modular cell. Bottom 114 has means 116a for engagement and/or securing by screwing or snap-fitting to a support; the edge of this bottom is provided with centering elements 117 on the side of the modular element to be fixed.

In the embodiment shown in FIG. 10, the metal head base receives, besides a regulated power supply, a controller central unit; so as to provide connection of a card not shown, it has a window 118 for passing therethrough a connector 600, bearing faces 119 for the corresponding faces of the connector and an indented housing 120 defining notches 121 for means securing the connector; elements 119, 121 of the base have functions similar to those 318, 320 of the rear faces of the modular cells.

Catches 122 are disposed so as to cooperate with the openings 203 of the shield 200 completing this base.

The connection assembly shown in FIGS. 8 and 9 combines the connectors 600 on the same multi-connector bus with flat cable or harness 601, the minimum pitch P1 between connectors being greater than the maximum pitch P2 of the pockets. Each connector has a T shape and comprises a front connecting face 602 and, on the wing of the T, front bearing faces 603 adapted for cooperation with the faces 119 of the base. A fixing and shielding member 700 (FIG. 9) associated with the connection assembly comprises a metal plate cut out and shaped so as to have lateral projections 701 and pressure fingers 702, this plate serving for locking the connectors after they are plugged into the cards.

The device described is assembled in the following way. The card guide cellular element 300 of each pocket is molded and bent as already described, then fitted into a shield 200, the catches 311 of the celluar element not yet being engaged in the openings 203 of the shield; the lugs 207 of the shield project from the cell. The basic modular cell is then assembled to base 110 by engaging the centering pins 322 in the corresponding holes 117 in the base, then by pushing the shield so as to cause translation thereof rearwardly until lugs 207 snap into the sleeves 116 and the shield abuts against the bottom 304 of the card guide cell; it should be noted that, during the translational movement of the shield, catches 311 are engaged in openings 203 so as to prevent any relative movement of the cellular element with respect to the shield.

The second modular cell is assemlbed in the same way to the first one and the third to the second. The structure is therefore strong and rigid because of the snap-fit of the shields which ensures electric connection thereof, while providing on the inside flexibility of introduction and connection of the electronic cards. It follows from the method of assembly described that the number of modular cells forming the same structure is not limited. The corresponding electronic card 400 is introduced in each modular cell 130 by sliding the card in slides 303; at the end of introduction, the end of tongue 308 of the cellular element is engaged in the guide projections 404 of block 401 integral with the card and the catch 403 penetrates into the V shaped recess 309 of the tongue, the length of the recess leaving a certain freedom of movement for the card.

The terminal strip 150 is then placed in position on the modular cell 130 and its fixing screw 151 is screwed into the anchor nut 402 in block 401; the terminal strip bears on the front face of cell 130 and screwing screw 151 further in then causes card 400 to be drawn forwards until catch 403 abuts against the sides of the V of recess 309, which centers and secures the card against movement with respect to the reception cell.

The connection assembly comprising the flat cable and the three connectors 600 is then brought close to the rear face of the modular structure and the connectors are introduced through the windows 312 of the modular cells and possibly window 118 of the base (in the embodiment shown in FIG. 10) and are plugged into the insertable zones or rear connectors of cards 400, until the faces 603 of the connectors are in abutment against faces 318, 119 of the modular cells or of the base.

Plate 700 is positioned on the back of the connectors and its projections 701 are engaged in the indented housing 319, 120 and the pressure fingers 702 bearing on the rear face 603 of each connector 600. It follows that the shield plate holds each connector 600 in its self-centered position with respect to the card previously immobilized and so the corresponding cellular element.

It follows from the above description that the cellular element 300, made rigid by addition of the corresponding shield 200, plays the role of positional reference at one and the same time for card 400 via slides 303 and the snap-fit recess 309 for the terminal strip 150 via screw 151, the anchor nut 402 and the snap-fit 309, 403 for the rear terminal strip via card 400 and bearing faces 318. Self-centering of the rear connectors on the cards already immobilized eliminates the usual requirements of aligning the connectors with respect to the empty cellular elements.

The exchange of a defective card 400 is effected by unscrewing screw 151 of the terminal strip 150, unplugging the terminal strip which remains connected to the modular cell by a retaining cord, unlocking the card by moving aside tongue 308 then pulling out the card preferably by taking hold of block 401. The replacement card is slid into slides 303, is connected at the end of travel to the rear connector 600, is fixed as before by snap-fitting 309, 403 and is locked after repositioning of the terminal strip 150 by screwing in screw 151.

What is claimed is:

1. An electronic card holding cell-like structure formed by assembling together at least two modular electronic card supporting and protecting cells, said modular cells each comprising a flat element or blank having two parallel edge portions, a front edge portion and a rear edge portion, a bottom extending perpendicularly to said blank from said rear edge portion and two lateral sides extending perpendicularly to said blank respectively from said two lateral edge portions, said lateral sides having guide means for the cards forming two respective lateral slides parallel to the blank and said lateral sides of the modular cell each comprise a first longitudinal edge portion adjacent the blank and a second longitudinal edge portion opposite the first one, these longitudinal edge portions comprising respectively complementary fixing means so as to allow fixing of two adjacent modular cells by assembly of the first longitudinal edge portions of the lateral sides of the first cell on the second longitudinal edge portions of the lateral sides of the second modular cell.

2. The structure as claimed in claim 1 further comprising a head base comprising at least one flat face equipped with fixing means complementary to those provided on said second longitudinal edge portions of the lateral sides of the modular cells.

3. The structure as claimed in claim 2, wherein said head base consists of a case which may contain electronic equipment connectable to the cards housed in the modular cells.

4. The structure as claimed in claim 2, wherein said base has a form similar to that of the modular cells and comprises a flat wall having two parallel lateral edge portions, a front edge portion and a rear edge portion and a bottom extending perpendicularly to said flat wall from said rear edge portion and two lateral sides extending perpendicularly to said flat element respectively from said two lateral edge portions and said lateral edge portions of said lateral sides which are opposite said flat wall are provided with fixing means complementary to those provided on said second edge portion of the lateral sides of the modular cells.

5. The structure as claimed in claim 1, wherein the bottom of said modular cells has at least one window for passing therethrough a rear connector pluggable into the rear connections of the card.

6. The structure as claimed in claim 5, wherein the rear face of the bottom of said modular cells has, at right angles to the window, bearing surfaces for corresponding faces of the connector as well as means for immobilizing said connector.

7. The structure as claimed in claim 6,
wherein said passage windows formed in the bottom have a width and a height greater than those of the rear connectors and said immobilizing means are adapted for immobilizing the connector in its first plug-in position.

8. The structure as claimed in claim 6,
wherein said immobilizing means are formed by a resilient pressure plate adapted to be engaged in an indented housing in the rear face of the cell.

9. The structure as claimed in claim 5 which comprises at least two modular electronic card supporting and protecting cells in which are engaged two respective electronic cards, said cards being spaced therebetween by a first pitch, wherein said rear connectors are mounted in a same flat multiconductor bus and are spaced from each other by a second pitch which is greater than the first pitch.

10. The structure as claimed in claim 1, wherein said modular cells are formed in two parts, namely:
a first part consisting of a cellular element made from an insulating material comprising a flat element or blank having two parallel lateral edge portions, a front edge portion and a rear edge portion and a bottom extending perpendicularly to said flat element from its rear edge portion and two lateral sides extending perpendicularly to said flat element respectively from its lateral edge portions, said lateral sides having means for guiding the cards forming two respective slides parallel to said blank, and
a metal shield having a U shaped section whose web is adapted at least to cover the blank of the cellular element and whose two wings come back against said two lateral sides so as to form, together, the two lateral sides of the modular cell.

11. The structure as claimed in claim 10, wherein the fixing means equipping the lateral sides of the modular cell are provided on the wings of the shield and ensure the electrical connection between said shields.

12. The structure as claimed in claim 10,
wherein the free edge portions of the wings of the shield comprise portions folded back inwardly so as to allow the cellular element to be fitted by sliding inside the shield.

13. The structure as claimed in claim 10,
wherein said fixing means consist of hooks projecting from the free edges of the wings of the shield and from corresponding cut-outs provided in the bending zone situated between the web and the wings of said shield, so that the hooks of one modular cell may be engaged in the cut-outs of an adjacent modular cell offset axially, locking then being provided by axial centring translation of one of the cells with respect to the other.

14. The structure as claimed in claim 10,
wherein said modular cells further comprise means for centering the cellular elements with respect to each other as well as means allowing self-centering of the cellular elements in their respective shields.

15. The structure as claimed in claim 14, wherein the means allowing self-centering of the cellular elements in their respective shields comprise openings forming latches for catches provided in corresponding positions on the blank of the cellular element.

16. The structure as claimed in claim 14, wherein the means allowing centering of the cellular elements with respect to each other comprise male elements on one of the longitudinal edge portions of the bottom which fit into female elements on the other longitudinal edge portion of the bottom.

17. The structure as claimed in claim 10,
wherein the arrangement of the centering elements and of the fixing elements equipping the shield of the modular cells is provided so that the structure may be assembled in the following steps:
(a) partial introduction by sliding of the cellular element of a first modular cell in its shield,
(b) centering of this cellular element with respect to the cellular element of a second adjacent modular cell already assembled, with engagement of the fixing means of the shield in the corresponding fixing means of the shield of the second cell.
(c) axial translation of the shield of the first cell until it is centered with respect to its own cellular element by said self-centering means and is locked on the shield of the second modular cell.

18. The structure as claimed in claim 10,
wherein said lateral sides of said cellular element are connected to the lateral edge portions of the blank by means of hinge connections.

19. The structure as claimed in claim 18, wherein said cellular element is made from a molded plastic material and said hinge connections consist of integrally molded flexible connecting lugs or lines of lesser thickness.

20. The structure as claimed in claim 18,
wherein the lateral sides of the cellular elements are held perpendicularly to the blank by means of a snap-fit device provided between the bottom and the lateral edge portions of the lateral sides adjacent said bottom.

21. An electronic card holding cell-like structure formed by assembling together at least two modular electronic card supporting and protecting cells, said modular cells comprising on one at least of their walls, at least one window for passing therethrough a rear connector pluggable into the rear connections of the card, said wall having at right angles to said window bearing surfaces for corresponding faces of the connector, as well as means for immobilizing said connector, wherein said passage windows have dimensions greater than those of the rear connectors and said immobilizing means are formed by a resilient pressure plate adapted for engagement in an indented housing of said wall of the cell so as to immobilize the connector in its first plug-in position.

22. The structure as claimed in claim 21, wherein said cells comprise at least two respective electronic cards spaced therebetween by a first pitch, and said rear connectors are mounted in a same flat multiconductor bus and are spaced from each other by a second pitch which is greater than the first pitch.

* * * * *